United States Patent
Dai et al.

(10) Patent No.: US 8,456,017 B2
(45) Date of Patent: Jun. 4, 2013

(54) FILLED THROUGH-SILICON VIA WITH CONDUCTIVE COMPOSITE MATERIAL

(75) Inventors: Ming-Ji Dai, Hsinchu (TW);
Heng-Chieh Chien, New Taipei (TW);
Ming-Che Hsieh, Kaohsiung (TW);
Jui-Feng Hung, Taichung (TW);
Ra-Min Tain, New Taipei (TW); John H. Lau, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 26 days.

(21) Appl. No.: 13/174,794

(22) Filed: Jul. 1, 2011

(65) Prior Publication Data

US 2012/0273939 A1    Nov. 1, 2012

(30) Foreign Application Priority Data

Apr. 27, 2011    (TW) .............................. 100114689 A (51) Int. Cl.
*H01L 23/48*    (2006.01)

(52) U.S. Cl.
USPC ............ 257/774; 257/E23.141; 257/E23.067; 257/E23.075; 257/E23.145; 257/E21.584; 257/686; 257/723; 257/777; 257/773; 257/737; 257/778; 257/738

(58) Field of Classification Search
USPC ................. 257/737, 738, 778, 774, 773, 668, 257/686, 777, 723, E21, 584, E23.141, E23.067, E23.075, E21.597, 621, E23.145, 257/E21.584
See application file for complete search history.

(56) References Cited

U.S. PATENT DOCUMENTS

| | | | |
|---|---|---|---|
| 6,312,621 | B1 | 11/2001 | Pedigo et al. |
| 7,666,768 | B2 | 2/2010 | Raravikar et al. |
| 8,048,794 | B2 * | 11/2011 | Knickerbocker ............. 257/774 |
| 2006/0027934 | A1 * | 2/2006 | Edelstein et al. ............. 257/774 |
| 2007/0001266 | A1 | 1/2007 | Arana et al. |
| 2008/0007890 | A1 | 1/2008 | Harmon et al. |
| 2008/0081386 | A1 * | 4/2008 | Raravikar et al. ............... 438/15 |
| 2008/0242079 | A1 | 10/2008 | Xu et al. |
| 2009/0250249 | A1 * | 10/2009 | Racz et al. .................... 174/252 |
| 2010/0200412 | A1 * | 8/2010 | Reid et al. ..................... 205/123 |
| 2012/0031768 | A1 * | 2/2012 | Reid et al. ..................... 205/123 |
| 2012/0205791 | A1 * | 8/2012 | Su et al. ........................ 257/682 |
| 2012/0228778 | A1 * | 9/2012 | Kosenko et al. ............. 257/774 |
| 2012/0235305 | A1 * | 9/2012 | Kim et al. ..................... 257/774 |

OTHER PUBLICATIONS

Yoshida et al., "Thermal properties of diamond/copper composite material", Microelectronics Reliability 44, 2004, p. 303-p. 308.
Medeliene et al., "The influence of artificial diamond additions on the formation and properties of an electroplated copper metal matrix coating", Surface and Coatings Technology 168, 2003, p. 161-p. 168.
Zhu et al., "Study on composite electroforming of Cu/SiCp composites", Materials Letters 58, 2004, p. 1634-1637.
Zhu et al., "Composite electroforming of Cu/SiCp composites", The Chinese Journal of Nonferrous Metals, Jan. 2004, vol. 14, No. 1, p. 84-p. 87.
Wang et al., "Through silicon vias filled with planarized carbon nanotube bundles", Nanotechnology 20, 2009, p. 1-p. 6.

* cited by examiner

*Primary Examiner* — A O Williams
(74) *Attorney, Agent, or Firm* — Jianq Chyun IP Office (57)    ABSTRACT

By adding particles of high thermal conductivity and low thermal expansion coefficient into the copper as a composite material and filling with the composite material into the through-via hole, the mismatch of the coefficient of thermal expansion and the stress of the through-silicon via are lowered and the thermal conductivity of the through-silicon via is increased.

20 Claims, 9 Drawing Sheets

FILLED THROUGH-SILICON VIA WITH CONDUCTIVE COMPOSITE MATERIAL

CROSS-REFERENCE TO RELATED APPLICATION

This application claims the priority benefit of Taiwan application serial no. 100114689, filed Apr. 27, 2011. The entirety of the above-mentioned patent application is hereby incorporated by reference herein and made a part of this specification.

BACKGROUND

1. Technical Field

The disclosure relates to an electrically connected structure and more particularly to a through-silicon via.

2. Related Art

The semiconductor industry adopts through-silicon vias (TSVs) to connect vertically stacked chips. As a result, the length of the leads between the chips is shortened, the dimension of the devices is reduced, and the three-dimensional stacked framework of the chips is established.

TSV structures require high thermo-mechanical reliability between batches for mass production. Due to the differences in the coefficients of thermal expansion (CTE) of a filling material in the TSVs and of the silicon substrate, the internal stress of the TSVs usually leads to plastic deformation, stress-induced voiding, and stress migration. Furthermore, the stress at the interface of the TSVs causes peeling and popping up of the filled materials (that is so called copper pumps).

Other than thermo-mechanical reliability issues, electrical conductivity of the TSVs should also be taken into consideration. Hence, not only the filling materials for the TSVs but also the filling method applied to fill the TSVs need to be wisely selected to enhance the reliability of TSVs.

SUMMARY

A through-silicon via (TSV) including at least one through-via hole penetrating a semiconductor wafer or an interposer wafer, an insulation layer and a bather layer completely covering a sidewall of the through-via hole, and a conductive material filling into the through-via hole and filled the through-via hole covering the insulation layer is introduced herein. The conductive material is a composite material at least including copper and particles of a supplementary material having a coefficient of thermal expansion (CTE) lower than that of copper. The supplementary material is selected from the group consisting of silicon carbide, diamond, beryllium oxide, aluminum nitride, aluminum oxide, and molybdenum.

A stacked chip structure including at least one chip disposed on a substrate is introduced herein. The chip or the substrate includes at least one TSV electrically connecting the chip and the substrate. The TSV includes at least one through-via hole, an insulation layer covering a sidewall of the through-via hole completely, and a conductive material filling into the through-via hole and filled the through-via hole that is covered with the insulation layer. The conductive material is a composite material at least including copper and particles of a supplementary material having a CTE lower than that of copper, where the supplementary material is selected from the group consisting of silicon carbide, diamond, beryllium oxide, aluminum nitride, aluminum oxide, and molybdenum.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

This disclosure is directed to a though-silicon via (TSV) and a fabrication method thereof, which helps reduce deformation or breakage of TSV caused by mechanical stress and thermal stress and enhance the reliability of the electrical connection of TSVs.

In the specification of this disclosure, a "chip" refers to conventional chips currently used in the electronic or semiconductor field, and includes, but is not limited to, a memory chip, a control chip, or a radio-frequency chip.

FIGS. 1A to 1H' are schematic diagrams illustrating a flowchart for fabricating a TSV according to an exemplary embodiment.

Figure 1A:
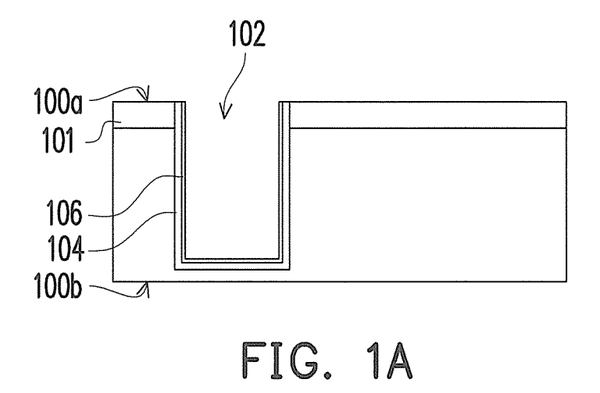
FIGS. 1A to 1H' are schematic diagrams illustrating a flowchart for fabricating a through-silicon via (TSV) according to an exemplary embodiment.

Referring to FIG. 1A, one or a plurality of via hole(s) 102 is formed in a substrate 100. Although only one is depicted in the diagram, a plurality of via holes can be formed in rows, columns, or arrays depending on the actual demand. The substrate 100 is a semiconductor wafer, an interposer wafer (such as a silicon wafer or a gallium arsenide wafer, or a glass wafer) or other heterogeneous substrates. An oxide layer 101 is disposed on the upper surface 100a of the substrate 100. The via hole 102 can be formed by a Bosch deep reactive ion etching (Bosch DRIE) process, a cryogenic DRIE process, a laser drilling process, or other anisotropic etching techniques, or even a wet etching process (an isotropic etching process), for example. The fabrication of the via holes 102 particularly desires the uniformity of the size of via hole contours and little or no residues in the via holes. Also, the rate of forming the via holes should meet the demand of relatively high fabrication speeds for mass production. The size or specification of the via holes 102 is determined upon various product demands in different fields. A diameter of the via holes 102 ranges from about 5 to 100 μm and a depth thereof ranges from 10 to 500 μm. The distribution pitch of the via holes 102 is about hundreds to thousands vias per chip.

As shown in FIG. 1A, after the via hole 102 is formed, an insulation layer 104 is deposited on a sidewall of the via hole 102 as an insulation material between the silicon substrate and the subsequently formed conductor. A method of depositing the insulation layer includes a thermal chemical vapor deposition (CVD) method, a plasma enhanced CVD method (PE-CVD), or a low pressure CVD method (LP-CVD). The insulation layer 104 is made of an oxide, a nitride, or a polymer, for example. Since the TSVs of large diameters may have high capacitance and inferior electrical property, a polymer insulation layer with the thickness ranging from about 2 μm to 5 μm can be applied. As the polymer insulation layer with a large thickness is a low dielectric material, the high capacitance problem generated from using conventional insulation films can be alleviated. The polymer is, for example, polyimide (PI). Adopting the polymer insulation layer not only reduces the ratio of copper in the via hole, but also decreases the thermal mechanical stress generated from the large difference between CTEs of silicon and copper. Moreover, the fabrication process of the polymer film is compatible with the wafer back-end processes.

As depicted in FIG. 1A, after the insulation layer 104 is formed, a barrier layer 106 is further formed on the insulation layer 104 to prevent copper diffusion. The barrier layer 106 is generally made of titanium (Ti), tantalum (Ta), or tantalum nitride (TaN), for example.

Figure 1B:
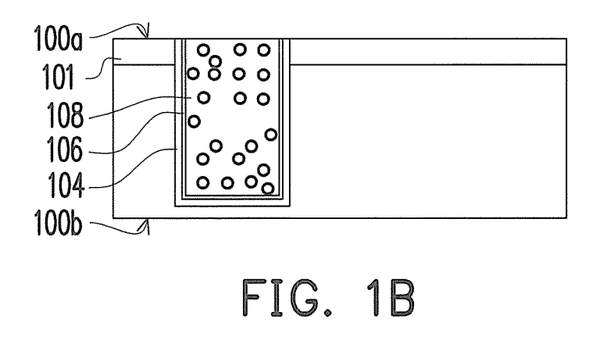

Referring to FIG. 1B, a conductive material 108 is filled into the via hole 102 to fill up the via hole 102. The conductive material generally used to fill the via hole can be copper (Cu), tungsten (W) or polysilicon. Herein, as copper has superior electrical conductivity, the TSV is normally filled with copper using copper electroplating. When the depth of the TSV is not too deep, copper electroplating can fill the via hole completely. However, when the depth of the TSV is deep, since the difference between the coefficient of thermal expansion of silicon (3 ppm/° C.) and the coefficient of thermal expansion of copper (16 ppm/° C.) is huge, the thermal mechanical stress will cause cracks generated between the interior of the TSV and the silicon substrate when copper electroplating is performed to fill the via hole completely. Thus, this disclosure adopts a copper-based composite conductive material as the filling material for the via hole 102. The conductive material 108 is a composite metal material including particles of a material with high thermal conductivity and low CTE (that is, supplementary material) added to a metal base. The material with high thermal conductivity and low CTE refers to a material with a CTE lower than that of the base (in terms of the copper-based composite material, that is, lower than copper) and a thermal conductivity higher than that of the base. Preferably, the CTE of the material is about lower than 10 ppm/° C. (copper has a CTE of 17 ppm/° C.). The material here includes, for example, silicon carbide, diamond, beryllium oxide, aluminum nitride, aluminum oxide, and/or molybdenum. In the diagram, the circles shown in the conductive material 108 merely represent the added supplementary material particles.

The copper-based composite material can be Ruined in the via hole 102 through filling, thermal pressing, or co-deposition electroplating. The co-deposition electroplating is performed in the exemplary embodiment; a recipe of the electroplating solution used and a fabrication thereof are illustrated below. A copper sulfate solution ($CuSO_2.5H_2O$: 210~240 g/L; $H_2SO_4$: 50~70 g/L) is used as an electrolytic solution, with an anode material including phosphorous copper and an anode of a thick copper plate. The second phase material includes particles with high thermal conductivity and low CTE (i.e. supplementary material particles). For instance, the particles can be particles of silicon carbide, diamond, beryllium oxide, aluminum nitride, aluminum oxide, or molybdenum with a particle diameter ranging from about tens of nanometers to tens of micrometers. One or more additive of a suitable amount can be added. For example, three kinds of additives: fluorocarbon surfactant, triethanolamine and hexamethylenetetramine can be mixed in a specific ratio with stirring, so that the second phase is effectively suspended in the electroplating solution.

By adding the second phase particles to prepare the copper-based composite material, not only can the superior electrical conductivity and thermal conductivity of copper be maintained, but better mechanical properties can also be obtained. Additionally, the physical or mechanical performance of the composite material can be modulated by the content of the second phase particles, such that the TSV structure filled by the copper-based composite material can be adjusted according to product demands. The adding ratio of the particles as the second phase material with high thermal conductivity and low CTE is less than or equal to 50% and ranges from about 5% to 50%.

After the via hole 102 is filled with the conductive material 108, a chemical mechanical polishing process or a grinding process is optionally performed to remove the excessive conductive material 108 and/or the barrier layer 106.

At this stage, the fabrication of the basic structure of a filled TSV has been completed. However, further processing is required on a bonding surface of the TSV for connecting vertically stacked chips or devices.

Figure 1C:
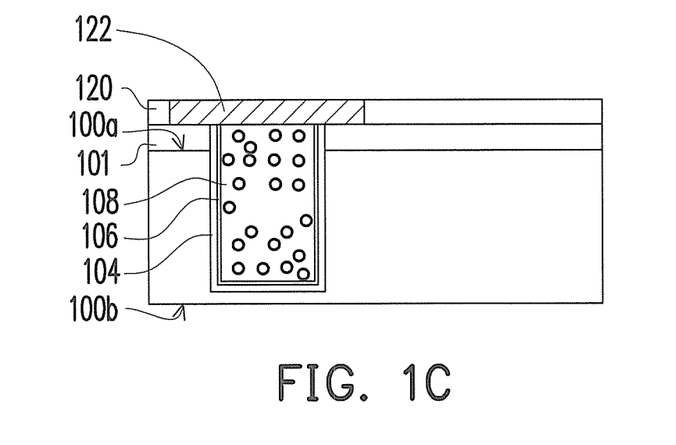

Referring to FIG. 1C, after a first passivation layer 120 is formed, a wiring pattern 122 is formed on the filled via 108/106/105 as a redistribution layer.

Figure 1D:
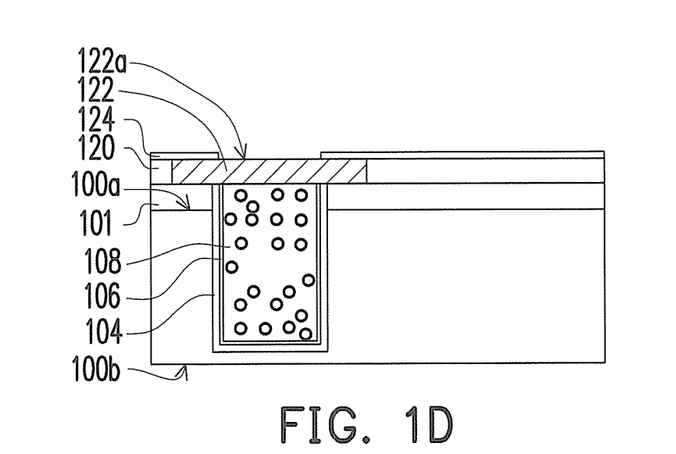

As shown in FIG. 1D, a patterned second passivation layer 124 is formed to expose a portion of the wiring pattern 122 located on the via 108/106/104 (an exposed portion is denoted with 122a).

Figure 1E:
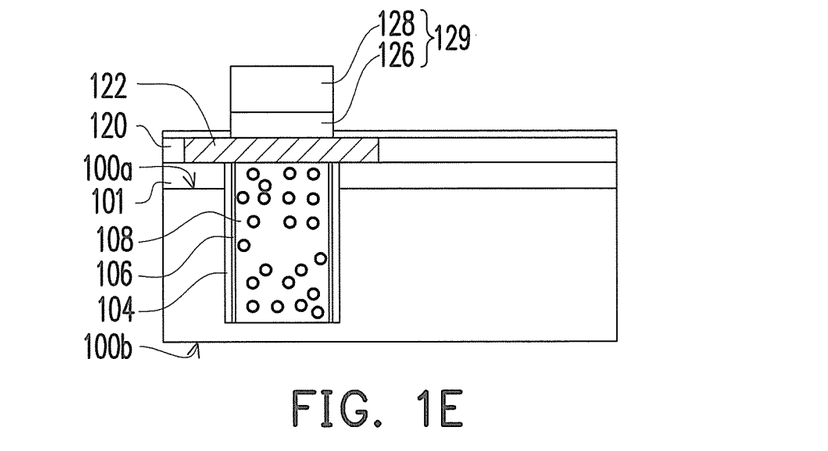

Referring to FIG. 1E, a first under-bump metallization (UBM) structure 129 is formed on the exposed wiring pattern 122a. The first UBM structure 129 includes a copper pad 126 and a bonding pad 128 formed on the copper pad 126. The material of the bonding pad 128 is, for example, nickel/palladium/gold (Ni/Pd/Au) or nickel/gold (Ni/Au).

Figure 1F:
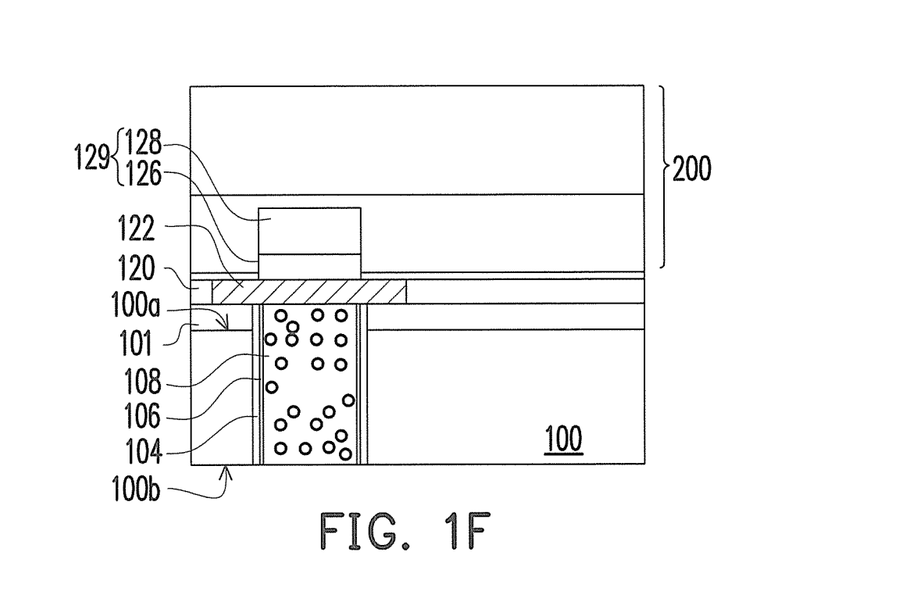

As shown in FIG. 1F, the substrate 100 is thinned from a lower surface 100b of the substrate 100 until the conductive material 108 in the via 108/106/104 is exposed. In the thinning process, a temporary carrier 200 is utilized to support the substrate 100. The temporary carrier 200, usually a silicon substrate or a glass substrate, is able to fix and then turn over the substrate or the wafer for the other side processing.

Figure 1G:
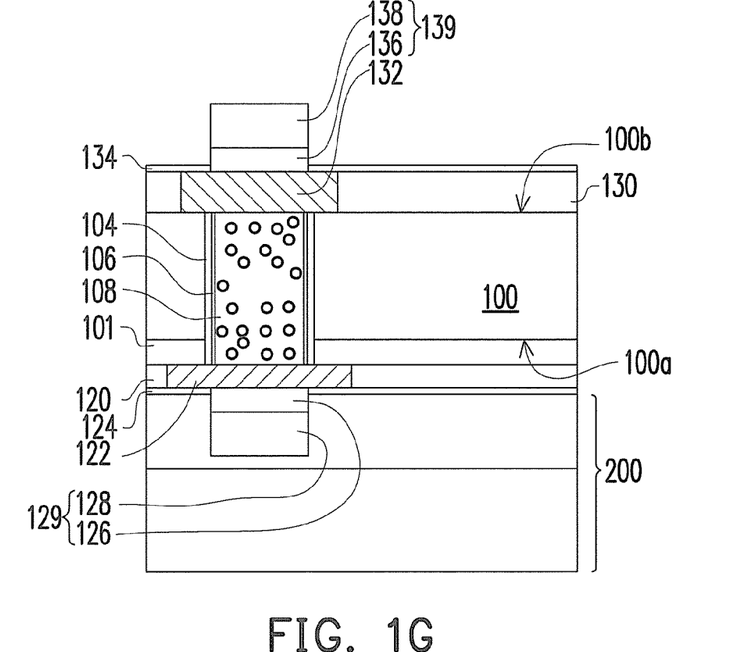

As shown in FIG. 1G, the substrate 100 is turned over and the surface 100b faces upwards. The steps described in FIGS. 1C to 1E are repeated to sequentially form a third passivation layer 130 and a fourth passivation layer 134 on the substrate surface 100b. Moreover, a back wiring pattern 132 and a second UBM structure 139 is formed sequentially on the via 108/106/104. The second UBM structure 139 includes a copper pad 136 and a bonding pad 138 formed on the copper pad 136. The material of the bonding pad 138 can be, for example, Ni/Pd/Au or nickel/gold Ni/Au. After the temporary carrier 200 is removed, a TSV structure 10A is formed as shown in FIG. 1H.

Alternatively, referring to FIG. 1G', the third passivation layer 130 and the fourth passivation layer 134 are sequentially formed on the substrate surface 100b, and the back wiring pattern 132, the copper pad 136, and a tin block 140 are formed sequentially on the via 108/106/104. The back wiring pattern 132 can function as a redistribution layer and the copper pad 136 and the tin block 140 can function as microbumps. After the temporary carrier 200 is removed, a TSV structure 10B is formed as shown in FIG. 1H'.

Figure 1H:
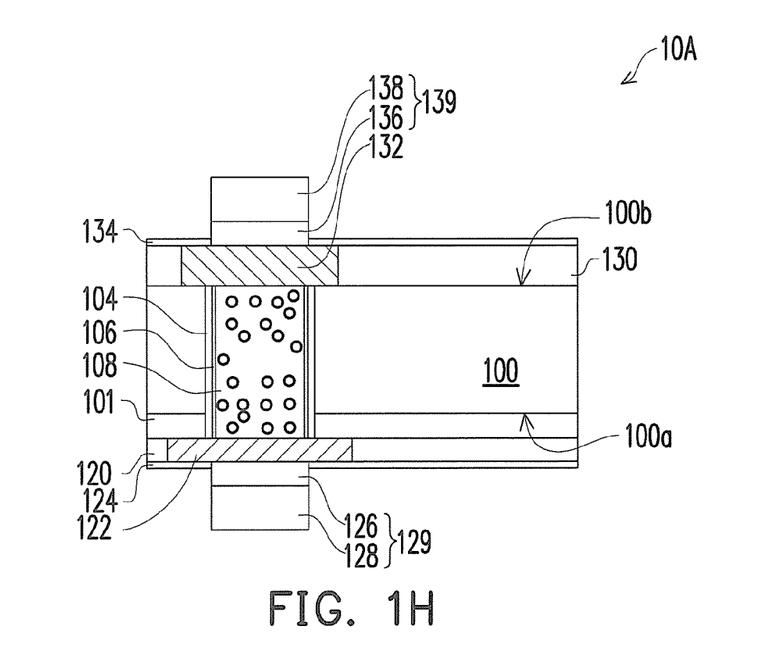

The structures shown in FIG. 1H and FIG. 1H' are different in that the potential components or objects connected to the surfaces of the TSVs. If using the TSV structure 10A in FIG. 1H as an interposer, both surfaces of the substrate 100 can be connected to the chips. The TSV structure 10B in FIG. 1H' can be formed within a semiconductor chip, so that one surface of the substrate 100 can be connected to another chip and the other surface can be connected to the interposer or other wiring substrates. When the TSV structure 10B is formed within the semiconductor chip, a wafer cutting process may have to be performed after FIG. 1H' to cut the wafer into a plurality of chips. The subsequent steps are well-known to persons skilled in the art and the details are thus omitted hereinafter.

Figure 2:
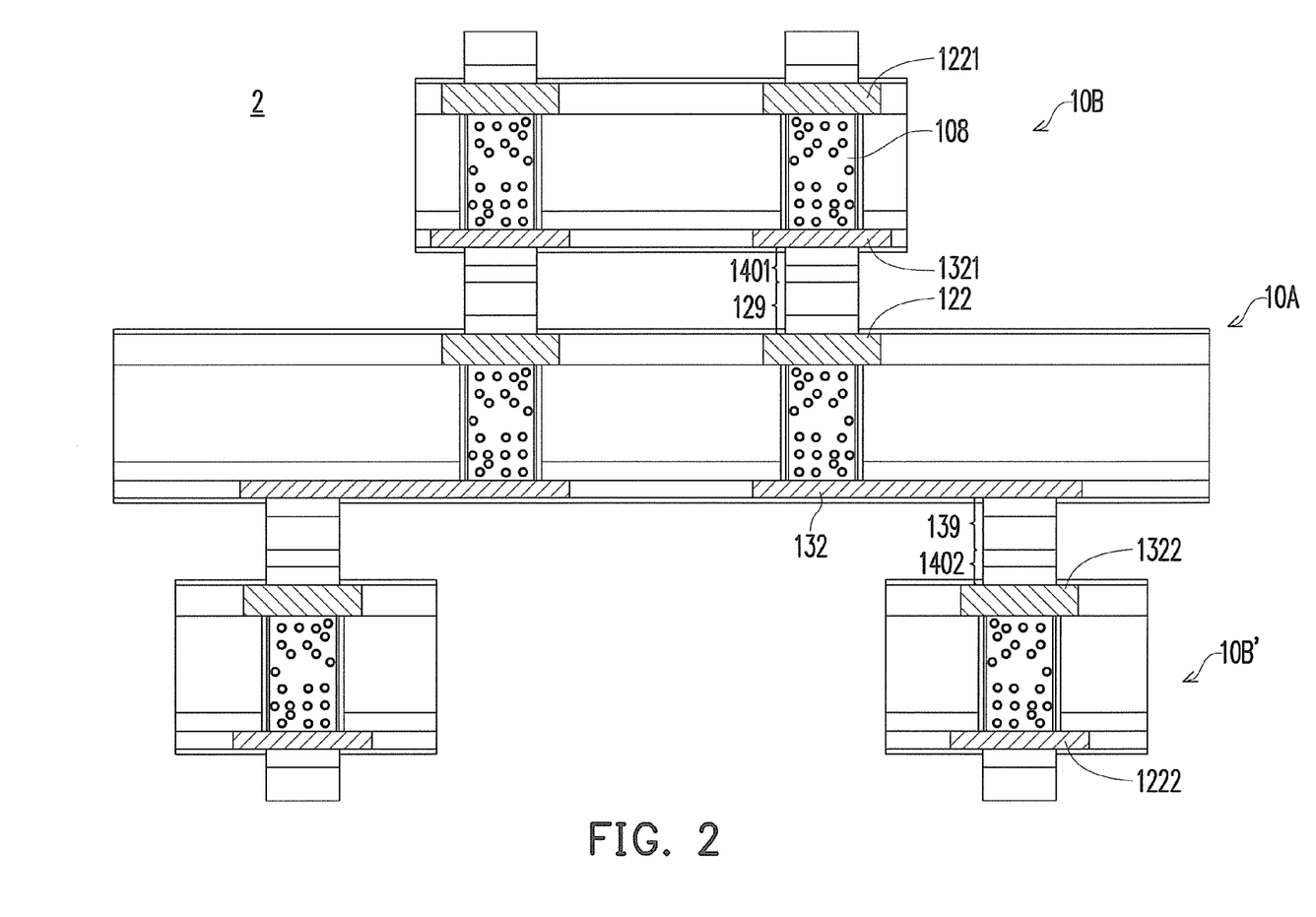
FIG. 2 is a schematic diagram illustrating a cross-sectional view of a stacked chip structure according to an exemplary embodiment.

The stacked chip structure in application of the above mentioned TSVs includes at least one or more chips disposed on one or two surfaces of at least one substrate. The chip or the substrate includes at least one TSV which electrically connects the chip and the substrate. FIG. 2 shows a stacked chip structure 2 formed by stacking two chips 10B and 10B', each having the TSV, on both surfaces of the interposer 10A that has at least one TSV. On the surfaces of the chips 10B and 10B' that face the substrate 10A, a plurality of wiring patterns 1321, 1322 covers the conductive material 108 and a plurality of micro-bumps 1401, 1402 located on the wiring patterns 1321, 1322. The chips 10B and 10B', for instance, are a control chip and a memory chip respectively. The wiring pattern 122 and the back wiring pattern 132 on the two opposite surfaces of the interposer 10A are not identical patterns. The interposer 10A can thus be connected to chip devices of different types or heterogeneous chips conveniently. The UBM structures 129, 139 are respectively disposed on the wiring patterns 122, 132 located on the two opposite surfaces of the interposer 10A.

Hence, chips of different functions or different sizes can be connected through the TSVs and further connected to the substrate or a printed circuit board.

Here, the materials used to fill the TSVs are compared to evaluate whether the requirements of high thermal conductivity and high mechanical performance for the TSVs can be satisfied. The TSV filled with only copper acts as the control to be compared with the TSV filled with a composite material of diamond-Cu (DiCu). The amount of diamond powder added to the composite material accounts for 50% of the total amount. The thermal mechanical simulation parameters resulted from the experiment are shown in Table 1. E represents Young's modules, v represents Poisson's ratio, and the CTE of the silicon at 25° C. and 100° C. as references.

TABLE 1

| Material | Young's modules E (GPa) | Poisson's ratio v | CTE (ppm/° C.) |
|---|---|---|---|
| Silicon | 129.617@25° C. 128.425@150° C. | 0.28 | 2.813@25° C. 3.107@150° C. |
| Silicon oxide | 70 | 0.16 | 0.6 |
| Copper | 110 | 0.35 | 17 |
| Diamond-copper (50% diamond) | 55.61 | 0.275 | 12 |

Figure 3:
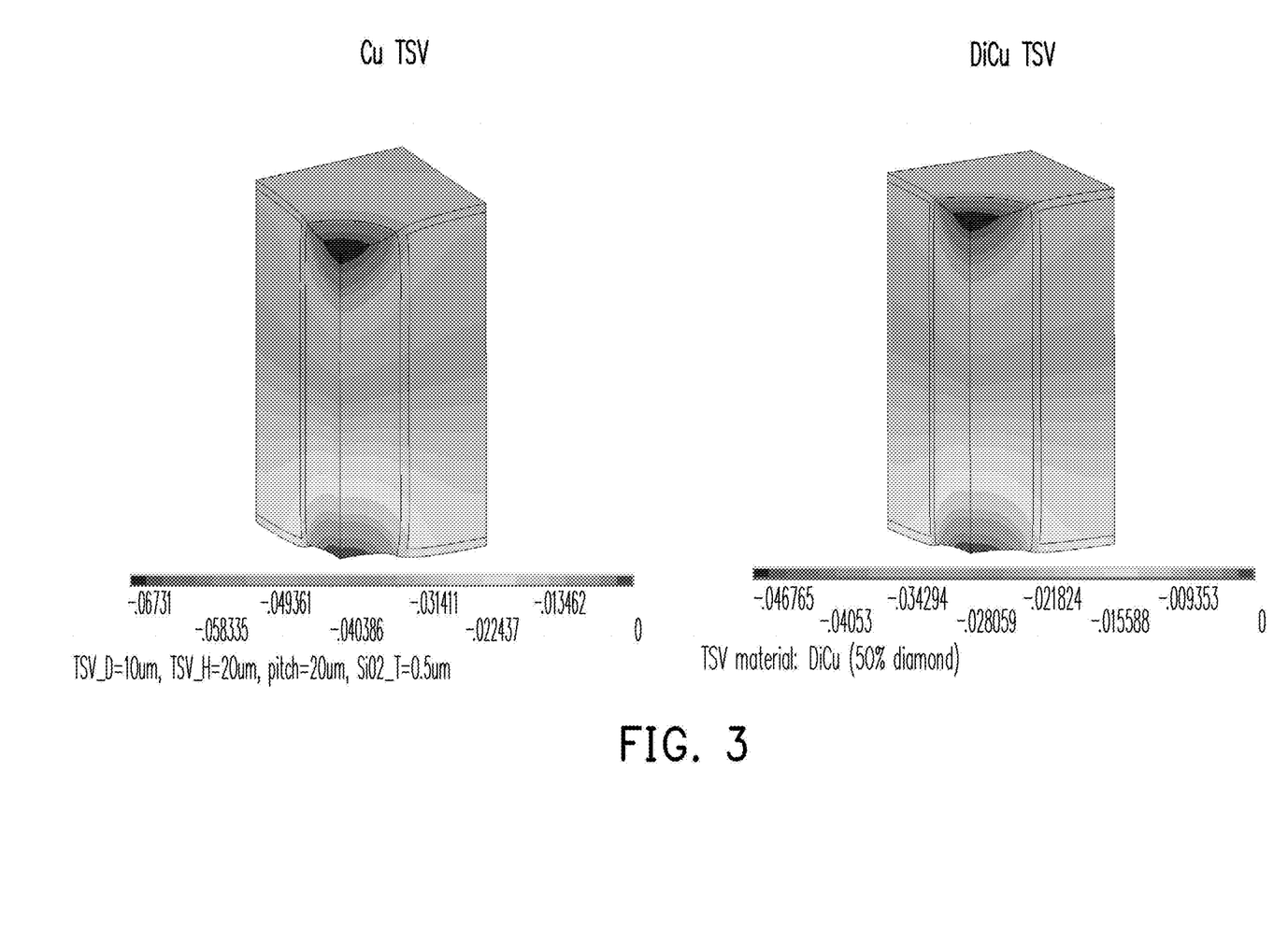
FIG. 3 shows a comparison of warpage of a copper-filled TSV and a diamond-copper composite material-filled TSV.
Figure 4:
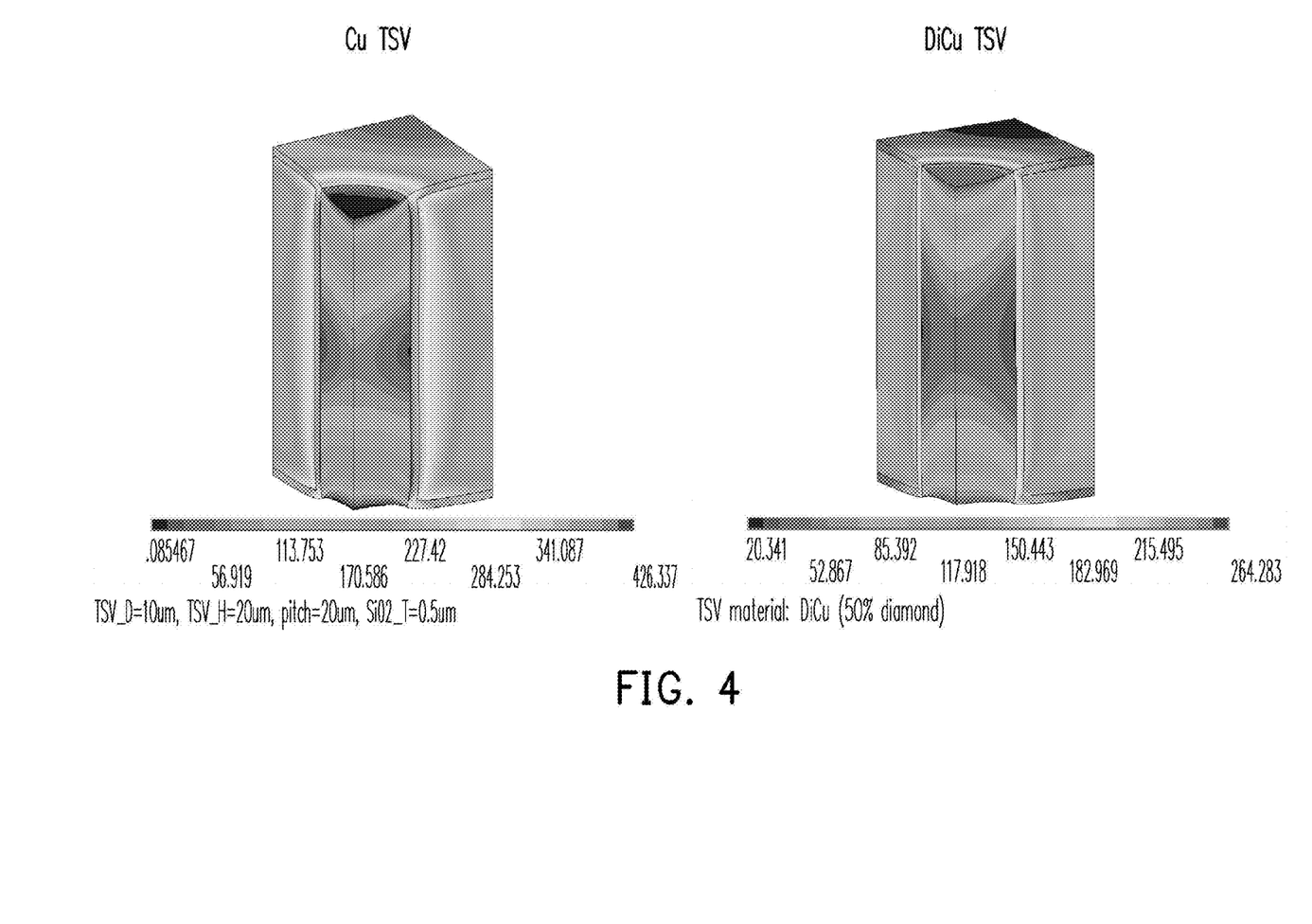
FIG. 4 shows a comparison of Von Mise stress of a copper-filled TSV and a diamond-copper composite material-filled TSV.
Figure 5:
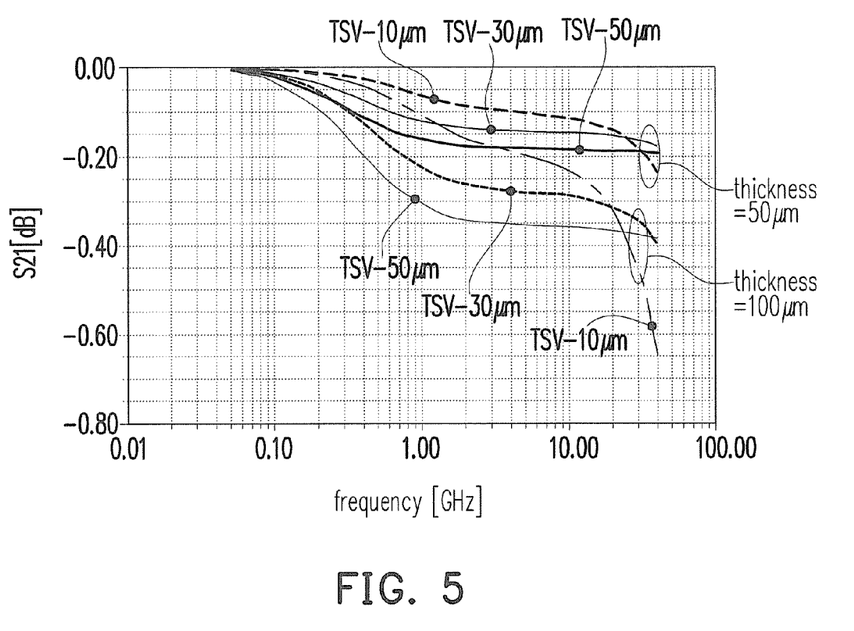
FIG. 5 shows a comparison of transmission coefficients S21 of a copper-filled TSV and a diamond-copper composite material-filled TSV.

As the CTE mismatch of the TSV filled with the DiCu composite material (denoted as DiCu TSV in the diagram) is less than that of the TSV filled with copper (denoted as Cu TSV in the diagram), the level of warpage can be reduced by 30% and the value of Von Mise stress is lowered by about 40% as depicted in the simulation results shown in FIGS. 3 and 4. The levels of other thermal mechanical properties (such as stress, strain) are also reduced with the addition of diamond powder particles. In terms of electric property simulation, as illustrated in the simulation result in FIG. 5, insertion loss coefficients S21 of Cu TSV and DiCu TSV have insignificant difference in the frequency band of 50 MHz to 40 GHz no matter the TSV has a diameter of 10, 30, or 50 μm. The electrical conductivity of the DiCu composite material is about $10^7$.

The diameter of the TSV should match the size of particles added in the composite material for better thermal conduction. In terms of thermal conduction, when 50% of diamond powder particles are added, the particle size is larger than 60 μm, the thermal conductivity coefficient of the DiCu composite material is larger than 400 W/mK of copper. When the particle size of the diamond powder is smaller than 20 μm, the thermal conductivity coefficient of the DiCu composite material changes with the addition of diamond powder, where a maximum value is achieved when the interface is properly treated. When the diameter of the DiCu TSV is larger than 30 μm, the thermal conductivity coefficient thereof can then be larger than the thermal conductivity coefficient of silicon (k=148 W/mK). Comparing TSVs of different diameters or thicknesses (filling depths), the TSV has higher thermal conductivity as the thickness of silicon decreases.

Comparing the TSV filled with a silicon carbide-copper (SiC—Cu) composite material and the TSV filled with copper, the addition percentage of SiC powder in the composite material is 20% to 30%. The TSV filled with the SiC—Cu composite material has a CTE mismatch smaller than the TSV filled with copper. The TSV filled with the SiC—Cu composite material therefore has higher thermal mechanical reliability.

This disclosure is directed to a TSV using a conductor material of a CTE close to the CTE of silicon. Also, a particle material of high thermal conductivity and low CTE is added to copper to fabricate a copper-based composite material for filling into the TSVs. As a consequence, the thermal mechanical issues of TSVs are solved and the reliability of TSVs is enhanced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A through-silicon via, comprising:
   at least one through-via hole disposed between a first surface and a second surface opposite to the first surface of a semiconductor wafer or an interposer wafer and penetrating the semiconductor wafer or the interposer wafer;
   an insulation layer and a barrier layer covering a sidewall of the through-via hole completely; and
   a conductive material filling into the through-via hole and filled up the through-via hole that is covered with the insulation layer, the conductive material being a composite material at least comprising copper and particles of a supplementary material having a coefficient of thermal expansion lower than a coefficient of thermal expansion of copper and a thermal conductivity higher than a thermal conductivity of copper, wherein the supplementary material is selected from diamond, beryllium oxide, aluminum nitride, or aluminum oxide.

2. The through-silicon via as claimed in claim 1, wherein a diameter of the particles of the supplementary material substantially ranges from tens of nanometers to tens of micrometers.

3. The through-silicon via as claimed in claim 1, wherein an addition ratio of the particles of the supplementary material is less than or equal to 50%.

4. The through-silicon via as claimed in claim 1, wherein an addition ratio of the particles of the supplementary material substantially ranges from 5% to 50%.

5. The through-silicon via as claimed in claim 1, further comprising a first wiring pattern located on the first surface and covering the conductive material filled in the through-via hole.

6. The through-silicon via as claimed in claim 5, further comprising a first under-bump metallization structure located on the first wiring pattern.

7. The through-silicon via as claimed in claim 6, wherein the first under-bump metallization structure comprises a copper pad and a bonding pad.

8. The through-silicon via as claimed in claim 1, further comprising a second wiring pattern located on the second surface and covering the conductive material filled in the through-via hole.

9. The through-silicon via as claimed in claim 8, further comprising a second under-bump metallization structure located on the second wiring pattern.

10. The through-silicon via as claimed in claim 9, wherein the second under-bump metallization structure comprises a copper pad and a bonding pad.

11. The through-silicon via as claimed in claim 8, further comprising a micro-bump located on the second wiring pattern.

12. The through-silicon via as claimed in claim 7, wherein a material of the bonding pad comprises nickel/palladium/gold or nickel/gold.

13. The through-silicon via as claimed in claim 10, wherein a material of the bonding pad comprises nickel/palladium/gold or nickel/gold.

14. A stacked chip structure, comprising:
at least one chip disposed on an interposer, the chip or the interposer comprising at least one through-silicon via electrically connecting the chip and the interposer, wherein the through-silicon via comprises:
at least one through-via hole;
an insulation layer and a barrier layer covering a sidewall of the through-via hole completely; and
a conductive material filling into the through-via hole and filled up the through-via hole that is covered with the insulation layer, the conductive material being a composite material at least comprising copper and particles of a supplementary material having a coefficient of thermal expansion lower than a coefficient of thermal expansion of copper and a thermal conductivity higher than a thermal conductivity of copper, wherein the supplementary material is selected from diamond, beryllium oxide, aluminum nitride, or aluminum oxide.

15. The stacked chip structure as claimed in claim 14, wherein a diameter of the particles of the supplementary material substantially ranges from tens of nanometers to tens of micrometers.

16. The stacked chip structure as claimed in claim 14, wherein an addition ratio of the particles of the supplementary material is less than or equal to 50%.

17. The stacked chip structure as claimed in claim 14, wherein an addition ratio of the particles of the supplementary material substantially ranges from 5% to 50%.

18. The stacked chip structure as claimed in claim 14, further comprising a first wiring pattern covering a surface of the through-silicon via and a first under-bump metallization structure located on the first wiring pattern.

19. The stacked chip structure as claimed in claim 18, further comprising a second wiring pattern covering another surface of the through-silicon via and a second under-bump metallization structure located on the second wiring pattern.

20. The stacked chip structure as claimed in claim 18, further comprising a second wiring pattern covering another surface of the through-silicon via and a micro-bump located on the second wiring pattern.

* * * * *